US009704235B2

(12) United States Patent
Sugiyama et al.

(10) Patent No.: US 9,704,235 B2
(45) Date of Patent: Jul. 11, 2017

(54) SEMICONDUCTOR INSPECTION SYSTEM

(75) Inventors: Akiyuki Sugiyama, Tokyo (JP); Yuichi Abe, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 273 days.

(21) Appl. No.: 14/234,977

(22) PCT Filed: Jul. 20, 2012

(86) PCT No.: PCT/JP2012/068416
§ 371 (c)(1),
(2), (4) Date: Mar. 31, 2014

(87) PCT Pub. No.: WO2013/015204
PCT Pub. Date: Jan. 31, 2013

(65) Prior Publication Data
US 2014/0219545 A1    Aug. 7, 2014

(30) Foreign Application Priority Data

Jul. 27, 2011 (JP) ................................. 2011-164782

(51) Int. Cl.
G06T 7/00    (2017.01)
G01B 15/08   (2006.01)
H01L 21/66   (2006.01)

(52) U.S. Cl.
CPC .............. *G06T 7/001* (2013.01); *G01B 15/08* (2013.01); *H01L 22/12* (2013.01); *H01L 2924/0002* (2013.01)

(58) Field of Classification Search
None
See application file for complete search history.

(56) References Cited

U.S. PATENT DOCUMENTS 5,943,437 A * 8/1999 Sumie ..................... G06T 7/001
                                                        382/145
7,786,437 B2   8/2010 Toyoda et al.
(Continued)

FOREIGN PATENT DOCUMENTS

JP    2007-079982 A    3/2007
JP    2007-256225 A   10/2007
(Continued)

OTHER PUBLICATIONS

International Search Report issued in International Patent Application No. PCT/JP2012/068416 dated Oct. 16, 2012.
(Continued)

Primary Examiner — Siamak Harandi
Assistant Examiner — Kate R Duffy
(74) Attorney, Agent, or Firm — McDermott Will & Emery LLP

(57) ABSTRACT

When the lengths of FEM wafers are automatically measured, not only the sizes of targets, the lengths of which are to be measured, are often varied from those in registration, but also the patterns of the targets are often deformed. Therefore, it is difficult to automatically determine whether the length measurement is possible or not. Therefore, the following are executed with a semiconductor inspection system: (1) a process of identifying the position of the contour line of an inspected image using a distance image calculated from a reference image, (2) a process of calculating a defect size image based on the position of the contour line with respect to the identified distance image, and detecting a defect candidate from the defect size image, and (3-1) a process of, upon detection of the defect candidate, calculating the size of the detected defect candidate, or (3-2) a process of detecting a portion different between the first and second contour lines as the defect candidate.

13 Claims, 7 Drawing Sheets

(56) References Cited

U.S. PATENT DOCUMENTS

| | | | |
|---|---|---|---|
| 7,925,095 B2 | 4/2011 | Sugiyama et al. | |
| 8,285,056 B2 | 10/2012 | Taguchi et al. | |
| 8,515,153 B2 | 8/2013 | Sugiyama et al. | |
| 2009/0052765 A1* | 2/2009 | Toyoda | G06K 9/00 382/149 |
| 2009/0232385 A1* | 9/2009 | Matsuoka | G06K 9/4609 382/145 |
| 2012/0098952 A1 | 4/2012 | Nakahira et al. | |

FOREIGN PATENT DOCUMENTS

| | | |
|---|---|---|
| JP | 2009-223414 A | 10/2009 |
| JP | 2011-055004 A | 3/2011 |
| JP | 2011-076810 A | 4/2011 |

OTHER PUBLICATIONS

F.Y. Shih et al., "Fast Euclidean distance transformation in two scans using a 3×3 neighborhood," Computer Vision and Image Understanding 93 (2004) 195-205, Elsevier.

* cited by examiner

SEMICONDUCTOR INSPECTION SYSTEM

RELATED APPLICATIONS

This application is the U.S. National Phase under 35 U.S.C. §371 of International Application No. PCT/JP2012/068416, filed on Jul. 20, 2012, which in turn claims the benefit of Japanese Application No. 2011-164782, filed on Jul. 27, 2011, the disclosures of which Applications are incorporated by reference herein.

TECHNICAL FIELD

The present invention relates to a semiconductor inspection system that inspects or measures semiconductor circuit patterns using charged particle beams.

BACKGROUND ART

With a reduction in the size of semiconductor devices (i.e., semiconductor integrated circuits), it has become difficult to form circuit structures in ideal shapes. Therefore, exposure simulation and circuit designing through optical proximity correction (OPC) have become of increasing importance. In the following description, the "optical proximity correction" is abbreviated to "OPC." The "exposure simulation" means an optical simulation of an exposure step that is conducted in forming a semiconductor circuit on a substrate. The "designing through OPC" means circuit designing that is conducted by taking into consideration the manufacturing conditions, in particular, the exposure conditions of semiconductors.

For both the "exposure simulation" and circuit "designing through OPC," it is necessary to inspect the optical properties of an exposure system in advance. During the inspection conducted in advance, representative values, such as the dimensions and shape, of the actually produced semiconductor structure are measured using a length-measuring scanning electron microscope. Usually, measurement procedures of a length-measuring scanning electron microscope are registered in a file called a recipe in advance, so that the length-measuring scanning electron microscope executes automatic measurement in accordance with the recipe.

By the way, automatic measurement of a FEM (Focus Exposure Matrix) wafer, which is conducted using a length-measuring scanning electron microscope to inspect the optical properties of an exposure system, has the following problems.

A first problem is that the size of a semiconductor structure to be measured differs depending on the exposure conditions. When identical semiconductor structures are produced under a plurality of different exposure conditions, the resulting semiconductor structures will have different widths and heights. In the automatic measurement, if the size of a structure to be measured is different from that registered in a recipe, it would be difficult to execute position collation (i.e., pattern matching) through image processing.

The second problem is that if a structure to be measured is not formed, erroneous measurement may be executed. In order to inspect the optical properties of an exposure system, a semiconductor structure is produced in the stage where the exposure conditions are not determined yet. Therefore, there may be cases where semiconductor structures cannot be formed depending on the exposure conditions used. Usually, a length-measuring scanning electron microscope captures an image of a structure to be measured, and outputs the dimensions of the structure calculated through software processing of the captured image. Because of such a mechanism, the length-measuring scanning electron microscope calculates values even when there is no structure formed in the image-capturing region. That is, the length-measuring scanning electron microscope calculates erroneous dimensions as the measured values.

Solutions to the first problem are described in Patent Literatures 1 and 2, for example. Patent Literatures 1 and 2 each disclose a method of allowing pattern matching to be performed on measurement targets with different sizes. A solution to the second problem is described in Patent Literature 3, for example. According to such patent literature, when a shape deformation is detected, pattern matching is determined to fail, and thus, execution of measurement is prohibited.

CITATION LIST

Patent Literature

Patent Literature 1: JP 2007-79982A
Patent Literature 2: JP 2007-256225 A
Patent Literature 3: JP 2009-223414 B

Non Patent Literature

Non Patent Literature 1: F. Y. Shih, Y.-T. Wu: "Fast Euclidean distance transformation in two scans using a 3×3 neighborhood," Computer Vision Image Understanding, vol. 93, 2004, p 195-205

SUMMARY OF INVENTION

Technical Problem

When the first problem and the second problem occur individually, such problems can be solved with the aforementioned solutions. However, when the first problem and the second problem occur concurrently, it would be impossible to solve the two problems concurrently with any of the aforementioned solutions.

In practice, in the production of semiconductor structures, when structures are produced under variously changed exposure conditions, and the dimensions of the thus produced structures are automatically measured, the sizes of the structures to be measured may differ depending on the exposure conditions, and there may be even cases where structures are not formed.

When the presence or absence of a target to be measured is not known in advance, a length-measuring scanning electron microscope is required to have a mechanism for determining whether measurement is executable or not depending on the presence or absence of a structure formed. Specifically, the length-measuring scanning electron microscope is required to have a mechanism for executing measurement when a structure is formed and not executing measurement when a structure is not formed. In other words, the length-measuring scanning electron microscope is required to have a tolerance to variations in size and have a mechanism capable of determining the presence or absence of a structure formed and also determining whether measurement is executable or not. However, with the existing solutions, it would be impossible to determine whether measurement is executable or not when a produced semiconductor has a changed size due to deformation as described above.

The inventor has conducted concentrated studies about the aforementioned technical problems, and arrived at an invention indicated below.

Solution to Problem

The inventor provides as an invention an inspection technique that is sensitive to a defect size. The invention includes (1) a process of identifying the position of the contour line of an inspected image using a distance image calculated from a reference image, (2) a process of calculating a defect size image based on the position of the contour line with respect to the identified distance image, and detecting a defect candidate from the defect size image, and (3) a process of, upon detection of the defect candidate, calculating the size of the detected defect candidate.

The inventor also proposes as an invention an inspection technique that is sensitive to the size of the contour of a defect. The invention includes (1) a process of extracting a first contour line from a reference image, (2) a process of extracting a second contour line from the detected image, and (3) a process of detecting a portion different between the first and second contour lines as a defect candidate.

Advantageous Effects of Invention

According to the present invention, defect detection that is sensitive to the size of a defect or the contour thereof can be realized. Other problems, structures, and advantageous effects will become apparent from the following description of embodiments.

DESCRIPTION OF EMBODIMENTS

Hereinafter, embodiments of the present invention will be described with reference to the drawings. It should be noted that embodiments of the present invention are not limited to those described below, and various variations are possible within the spirit and scope of the present invention.

Embodiment 1

[System Configuration]

Figure 1:
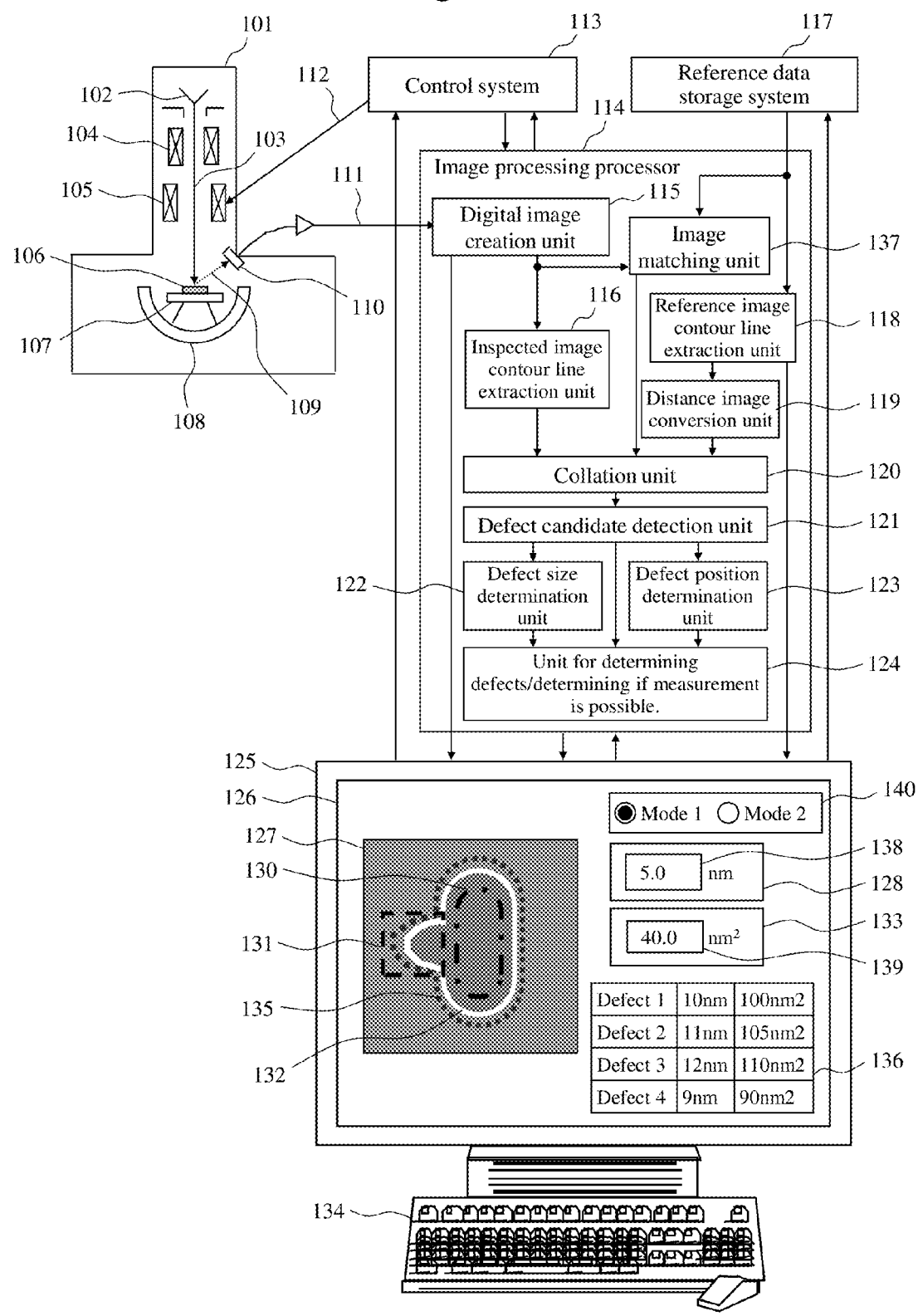
FIG. 1 is a view showing an exemplary schematic configuration of a semiconductor inspection system.

FIG. 1 shows an exemplary schematic configuration of a defect inspection system that is an exemplary semiconductor inspection system in accordance with an embodiment. This embodiment will describe a case where an inspected image is acquired using an electron beam. That is, a case where an electron microscope 101 is used for inspection of a sample 106 will be described. Needless to say, an inspected image can also be acquired using an ion beam. Hereinafter, the device configuration that uses the electron microscope 101 will be described.

The electron microscope 101 has arranged therein an electron gun 102 as an electron source. An electron beam 103 emitted from the electron gun 102 is converged by an electron lens 104 and is caused to irradiate the surface of the sample 106. A secondary signal 109, such as secondary electrons and reflected electrons, is generated from a position irradiated with the electron beam 103. The secondary signal 109 is detected by an electron detector 110, and is converted into an intensity signal 111 representing the intensity of the signal. Herein, deflection of the electron beam 103 is controlled by a deflecting magnetic field generated by a deflector 105. By such deflection control, the position irradiated with the electron beam 103 on the sample 106 is raster-scanned. Raster scan with the electron beam 103 is controlled by a control signal 112 generated by a control system 113.

The intensity signal 111 is provided to an image processing processor 114, and is converted into a digital signal by an A/D converter circuit (not shown). The intensity signal that has been converted into a digital signal is provided to a digital image creation unit 115. The digital image creation unit 115 generates an inspected electron microscope image 127 from the provided digital signal. The thus generated inspected electron microscope image 127 is displayed on an operation screen 126 of a display device 125. The operation screen 126 displays an image field to be checked by an operator and a character/numerical value entry field. Characters and numerical values are input via an operating device 134.

It should be noted that the sample 106 is mounted on a sample table 107, and the position and tilt of the sample table 107 with respect to the electron beam 103 are drive-controlled by a sample table control device 108. Such drive control allows a region irradiated with the electron beam 103 (i.e., a raster-scanned range) to be movable on the sample 106.

The control system 113 controls imaging and inspection of the sample 106 (e.g., a semiconductor wafer) performed by the electron microscope 101, based on information on the region to be inspected. The control system 113 communicates with the image processing processor 114 to exchange information necessary for the processing operation. The control system 113 inputs characters or numerical values, which have been entered via the operation screen 126, via the display device 125. It should be noted that each of the electron microscope 101, the control system 113, the image processing processor 114, the display device 125, and the reference data storage system 117 has a communication device (not shown) used for exchanging data.

The image processing processor 114 includes an arithmetic unit and a storage unit (i.e., ROM and RAM) (not shown), and provides processing functions indicated below through processing of programs. It should be noted that each processing function may be partially or entirely implemented as hardware.

The image matching unit 137 is a processing unit that executes alignment between an inspected image and a reference image. The inspected image herein corresponds to the inspected electron microscope image 127 generated by the digital image processing unit 115. The reference image is provided as reference data input from the reference data storage system 117. For the reference data, one of circuit design data, reticle pattern data for exposure, an exposure simulation result, an electron microscope image, or the like is used. When circuit data is used as the reference data, the image matching unit 137 performs alignment between the inspected image and the reference image using the existing technology disclosed in Patent Literature 1 or 2.

An inspected image contour line extraction unit 116 creates an inspected image contour line 135 corresponding to the outline of a structure 132 from the inspected electron microscope image 127. In the operation screen 126 in FIG. 1, the inspected image contour line 135 is represented by a dotted line.

A reference image contour line extraction unit 118 creates a reference image contour line 130 corresponding to the outline of the reference image. In the operation screen 126 in FIG. 1, the reference image contour line 130 is represented by a dashed line.

A distance image conversion unit 119 creates a reference distance image (described below) from the reference image contour line 130. For creation of the reference distance image, a known distance image creation method is used. Examples of the known distance image creation method include a method described in Non Patent Literature 1. In this embodiment, as the reference distance image, information on the distance from the reference image contour line 130 is defined as the luminance value of the image. Thus, pixel rows each having identical luminance values are arranged concentrically with respect to the reference image contour line 130.

A collation unit 120 collates the inspected image contour line 135 with the reference distance image, and generates at the pixel points on the inspected image contour line 135 a defect size image including distance information. During the collation, the collation unit 120 acquires from the image matching unit 137 positional information in which the inspected image matches the reference image. In this embodiment, two methods are prepared as a method for generating a defect size image, and which of the two methods should be applied can be instructed via the operation screen 126.

The defect candidate detection unit 121 applies a blob detection process to the defect size image to detect a defect candidate. The term "blob" means a group of pixels having identical luminance values. In this embodiment, a luminance value is given as information on the distance from the reference image contour line 130. The defect candidate detection unit 121 extracts a group of pixels whose luminance values are greater than a determination threshold as a candidate region of defects, and sets the group as a defect extraction image. The defect extraction image is provided to a defect size determination unit 122, a defect position determination unit 123, and a unit 124 for determining defects/determining if measurement is possible.

The defect size determination unit 122 determines information on the size of the candidate region. In this embodiment, the area of the candidate region is calculated as the size. The calculated area is provided as the size information to the unit 124 for determining defects/determining if measurement is possible.

The defect position determination unit 123 determines the position of the candidate region. That is, the defect position determination unit 123 determines the position of a defect region 131 (e.g., the maximum distance from the reference image contour line 130). The determined positional information is provided to the unit 124 for determining defects/determining if measurement is possible.

The unit 124 for determining defects/determining if measurement is possible determines if the candidate region is defective or not based on the size information and/or the positional information. For example, the unit 124 for determining defects/determining if measurement is possible compares the size information (i.e., the area of the candidate region) with a determination threshold, and determines the candidate region to be defective if the size information thereof is greater than the determination threshold, and determines the candidate region to be not defective if the size information thereof is less than the determination threshold. In addition, the unit 124 for determining defects/determining if measurement is possible compares the positional information with a determination threshold, and determines the candidate region to be defective if it includes a pixel whose distance is greater than the determination threshold, and determines the candidate region to be not defective if it includes only pixels whose distances are less than the determination threshold.

The determination threshold herein is given as an input value to the operation screen 126. Needless to say, the initial value may also be used. In addition, a determination result for each candidate region is output to the operation screen 126. It should be noted that the unit 124 for determining defects/determining if measurement is possible determines if measurement (e.g., length measurement) is executable based on the determination of the presence or absence of defects. Information about if measurement is executable is output to a length-measuring scanning electron microscope (not shown) from the unit 124 for determining defects/determining if measurement is possible. It should be noted that the length-measuring scanning electron microscope may be the electron microscope 101. When execution of measurement is permitted, the length-measuring scanning electron microscope reads a recipe from a storage region (not shown), and executes an automatic length-measuring operation.

On the operation screen 126 shown in FIG. 1, the inspected electron microscope image 127 of the sample 106, the reference image contour line 130 (dashed line), the defect region 131 (broken line), and the inspected image contour line 135 (dotted line) are displayed. Besides, a defect dimension threshold entry field 128, a defect area threshold entry field 133, a defect list 136, and a mode switching entry field 140 are displayed on the operation screen 126.

A determination threshold (i.e., a dimension value) to be used by the defect position determination unit 123 is input to the defect dimension threshold entry field 128. In FIG. 1, "5.0 nm" is input as a threshold 138. A determination threshold (i.e., a dimension value) to be used by the defect size determination unit 122 is input to the defect area threshold entry field 133. In FIG. 1, "40.0 $nm^2$" is input as a threshold 139. Such numerical values are input via the operation device 134. Although FIG. 1 represents a case where the operation device 134 is a keyboard, other input devices, such as a mouse and a stylus pen, may also be used.

The defect list 136 displays information about a plurality of candidate regions that have been determined to be defective by the defect size determination unit 122 and/or the defect position determination unit 123. In the defect list 136, the number that identifies a defect is associated with positional information and size information. In the mode switching entry field 140, a button in a toggle switch form is displayed to allow one of the two methods for creating a defect size image (described below) to be selectable. Herein, the two creation methods are indicated by "Mode 1" and "Mode 2."

[Operation of Extracting Inspected Image Contour Line and Operation of Creating Reference Distance Image]

Figure 2:
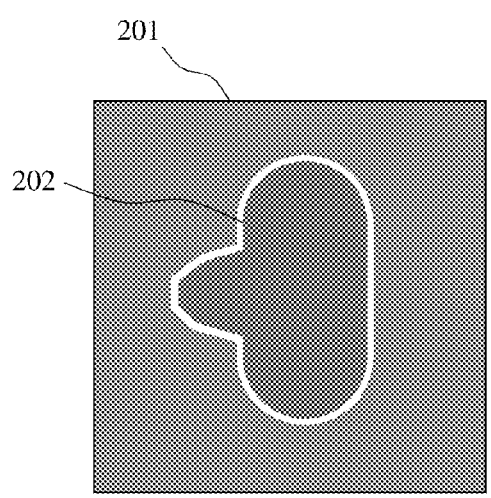
FIG. 2 is a view illustrating an inspected image contour line, a reference contour line image, and a reference distance image.
Figure 2:
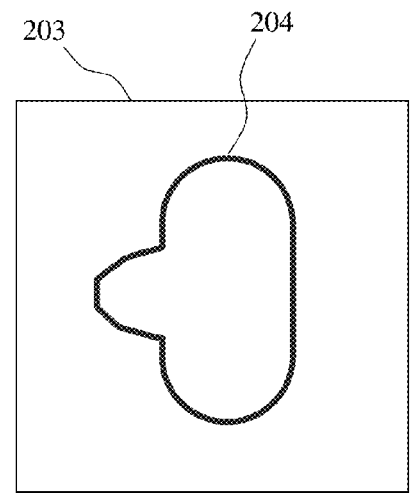
Figure 2:
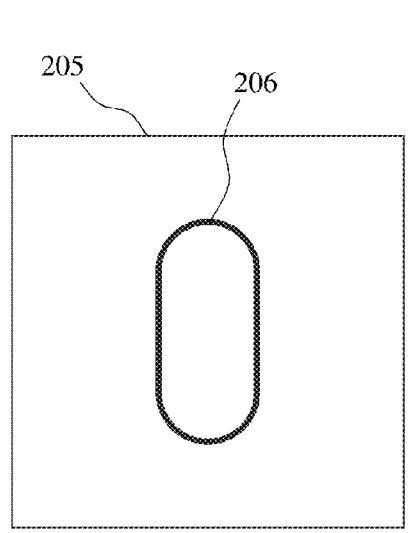
Figure 2:
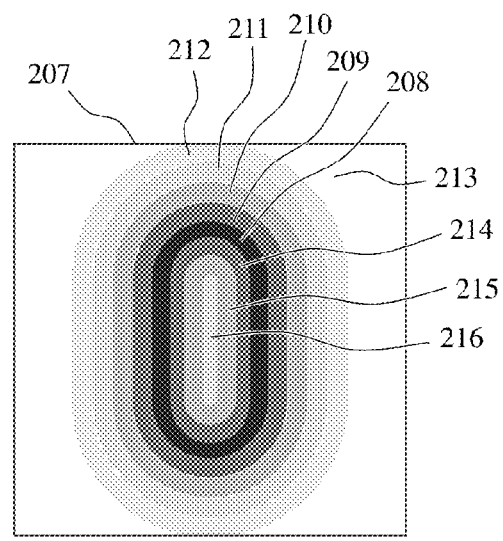

FIG. 2 shows the content of the processing operations executed by the inspected image contour line extraction unit 116 and the distance image conversion unit 119.

The inspected image contour line extraction unit 116 extracts an inspected image contour line 204 corresponding to the outline of a structure 202 from the inspected electron microscope image 201 and creates an inspected contour line image 203. Herein, as a method for extracting the inspected image contour line 204 from the inspected electron microscope image 201, various known methods can be applied. For example, it is possible to apply a method of smoothing the inspected electron microscope image 201 using a Gaussian filter, and thereafter emphasizing the contour of the structure 202 using a secondary differentiation filter, and further binarizing the luminance value of the image obtained after emphasizing the contour. As a result of such process, the inspected contour line image 203 with the extracted inspected image contour line 204 is created. It should be noted that when there is no structure created, the inspected image contour line 204 is not extracted, or a small inspected image contour line 204 is extracted.

Meanwhile, the distance image conversion unit 119 inputs a reference contour line image 205, which has been obtained by converting a reference image contour line 206 into an image, from the reference image contour line extraction unit 119. As described above, examples of the reference data for providing a reference image include circuit design data, reticle pattern data for exposure, an exposure simulation result, and an electron microscope image. Each of the circuit design data, the reticle pattern data for exposure, and the exposure simulation result is typically contour line data formed by a group of vertices. Thus, it is obvious that such data is used as the reference contour line image 205. When an electron microscope image is used, it is possible to convert reference data into the reference contour line image 205 with the extracted reference image contour line 206 using the same method as a method for converting the inspected electron microscope image 201 into the inspected contour line image 203.

The distance image conversion unit 119 creates a reference distance image 207 by applying a distance image conversion process to the reference image contour line 206 of the reference contour line image 205. As described above, the distance image conversion unit 119 executes a distance image conversion process by using a commonly known method such as the one described in Non Patent Literature 1. In the reference distance image 207, the luminance value of the image is higher at a position farther from the reference image contour line 206.

In this specification, a region of the reference distance image 207 that overlaps the reference image contour line 206 is referred to as a "distance zero region" 208. This indicates that the distance of pixels in this region from the reference image contour line 206 is less than a unit distance. Further, in this specification, regions that expand concentrically outward from the reference image contour line 206 are referred to as a "distance 1 region" 209, a "distance 2 region" 210, a "distance 3 region" 211, and a "distance 4 region" 212 in this order. The "distance 1 region" 209 indicates that the distance of pixels in this region from the reference image contour line 206 is not less than a unit distance and less than 2 units. The same holds true for the other regions.

It should be noted that regions with different luminance values are also set in a region 213, which is the outer region of the "distance 4 region" 212, in accordance with the distance from the reference image contour line 206. However, such regions are omitted in FIG. 2 for the sake of convenience. In addition, a "distance 1 region" 214, a "distance 2 region" 215, and a "distance 3 region" 216 are also arranged concentrically on the inner side of the reference image contour line 206.

In this specification, all of the pixels located within the "distance zero region" 208 have a luminance value of "zero." All of the pixels located within the "distance 1 region" 209 and the "distance 1 region" 214 have a luminance value of "1." All of the pixels located within the "distance 2 region" 210 and the "distance 2 region" 215 have a luminance value of "2." All of the pixels located within the "distance 3 region" 211 and the "distance 3 region" 216 have a luminance value of "3." All of the pixels located within the "distance 4 region" 212 have a luminance value of "4." The pixels located in the region 213 have different luminance values depending on the distance from the reference image contour line 206. Herein, such pixels are omitted for the sake of convenience.

In this embodiment, the luminance value is set using a specific unit, such as a gray scale value (i.e., gray level), a reduced scale value (e.g., units of nm) of the actual dimension of the imaging target, or the distance of a pixel within the image (e.g., pixels).

[Collation Operation]

Figure 3:
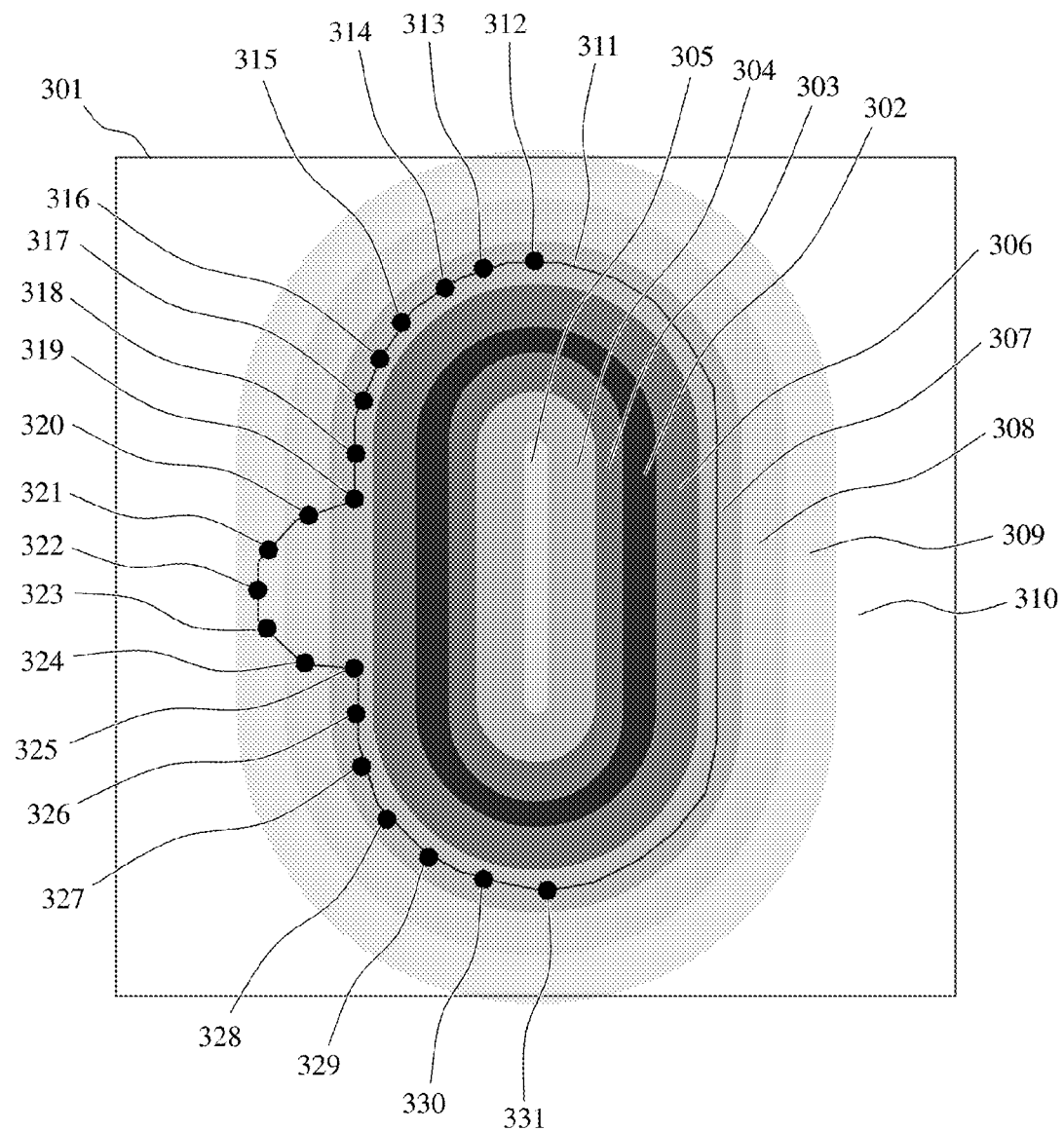
FIG. 3 is a view illustrating collation between an inspected image contour line and a reference distance image.

FIG. 3 shows the content of the operation of the collation unit 120 to collate the inspected image contour line 135 with the reference distance image 207. A defect size image is created through such a process. In FIG. 3, an inspected image contour line 311 is overlaid on a reference distance image 301. For overlaying, information for aligning the inspected image with the reference image from the image matching unit 137 is used. It should be noted that the reference distance image 301 has the same structure as that illustrated in FIG. 2. FIG. 3 shows an enlarged view of FIG. 2 to illustrate the detailed collation operation.

The reference distance image 301 includes a "distance zero region" 302, a "distance 1 region" 306, a "distance 2 region" 307, a "distance 3 region" 308, a "distance 4 region" 309, a "region" 310, a "distance 1 region" 303, a "distance 2 region" 304, and a "distance 3 region" 305. Regions with different luminance values are also set sequentially in the "region" 310 in accordance with the distance from the reference image contour line. However, such regions are omitted in FIG. 3.

FIG. 3 represents some of the pixels that form the inspected image contour line 135, that is, pixels 312, 313, 314, 315, 316, 317, 318, 319, 320, 321, 322, 323, 324, 325, 326, 327, 328, 329, 330, and 331. Needless to say, a number of pixels other than these are also present on the inspected image contour line 311. In FIG. 3, such pixels are omitted for the sake of convenience.

When the inspected image contour line 311 is overlaid on the reference distance image 301, the pixels 312, 313, 314, 315, 316, 317, 318, 319, 325, 326, 327, 328, 329, 330, and 331 are located on the "distance 2 region" 307. The pixels 320 and 324 are located on the "distance 3 region" 308. The pixels 321, 322, and 323 are located on the "distance 4 region" 309.

Example 1 of Creation of Defect Size Image

Figure 4:
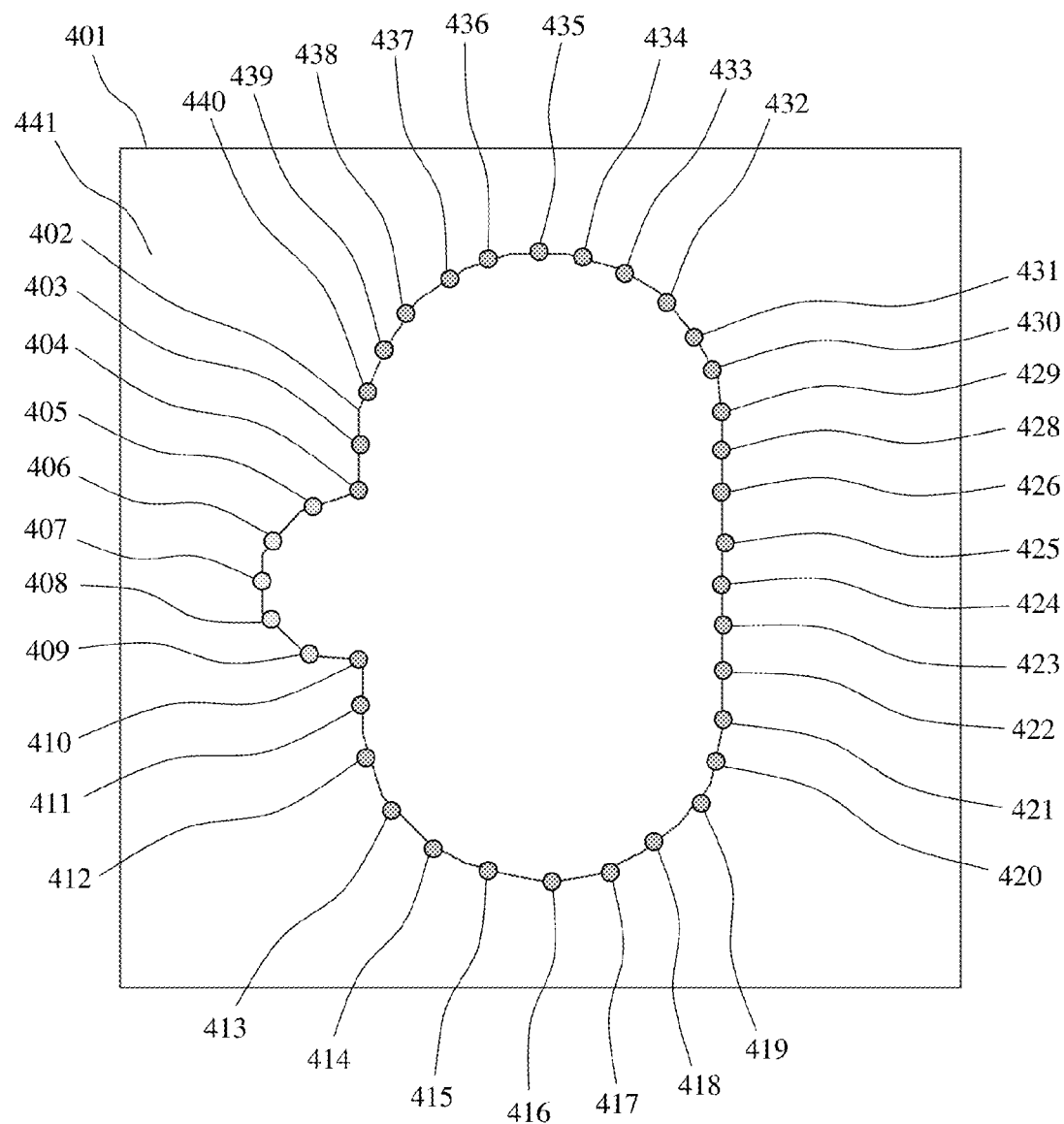
FIG. 4 is a view showing a defect size image created through collation between an inspected image contour line and a reference distance image.

FIG. 4 exemplarily shows a method for creating a defect size image 401 as a result of the collation operation of the collation unit 120. In the defect size image 401, each pixel that forms the inspected image contour line 311 is associated with a luminance value of a corresponding region on the reference distance image 301. In FIG. 4, a difference in luminance value is represented by a gray level.

The collation unit 120 converts the pixels 312, 313, 314, 315, 316, 317, 318, 319, 325, 326, 327, 328, 329, 330, and 331 on the "distance 2 region" 307 in FIG. 3 into pixels 403, 404, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, and 440 on the defect size image 401. The pixels after the conversion have an unchanged luminance value of "2" from that of the "distance 2 region" 307.

Likewise, the collation unit 120 converts the pixels 320 and 324 on the "distance 3 region" 308 in FIG. 3 into pixels 405 and 409 on the defect size image 401. The pixels after the conversion have an unchanged luminance value of "3" from that of the "distance 3 region."

Although FIG. 4 shows only representative pixels that partially form the inspected image contour line 402 for the sake of convenience, all of the pixels on the inspected image contour line 402 have the luminance values on the reference distance image 301. The range of the luminance values of the pixels on the inspected image contour line 402 is zero to the distance of the diagonal line of the image. In this embodiment, "zero," a value that is less than or equal to "−1," or other specific luminance values are given to pixels in an outer region 441 of the inspected image contour line 402. Herein, as the specific given values, a value outside the range of the luminance values given to the inspected image contour line 402, and the like are considered.

Example 2 of Creation of Defect Size Image

Figure 5:
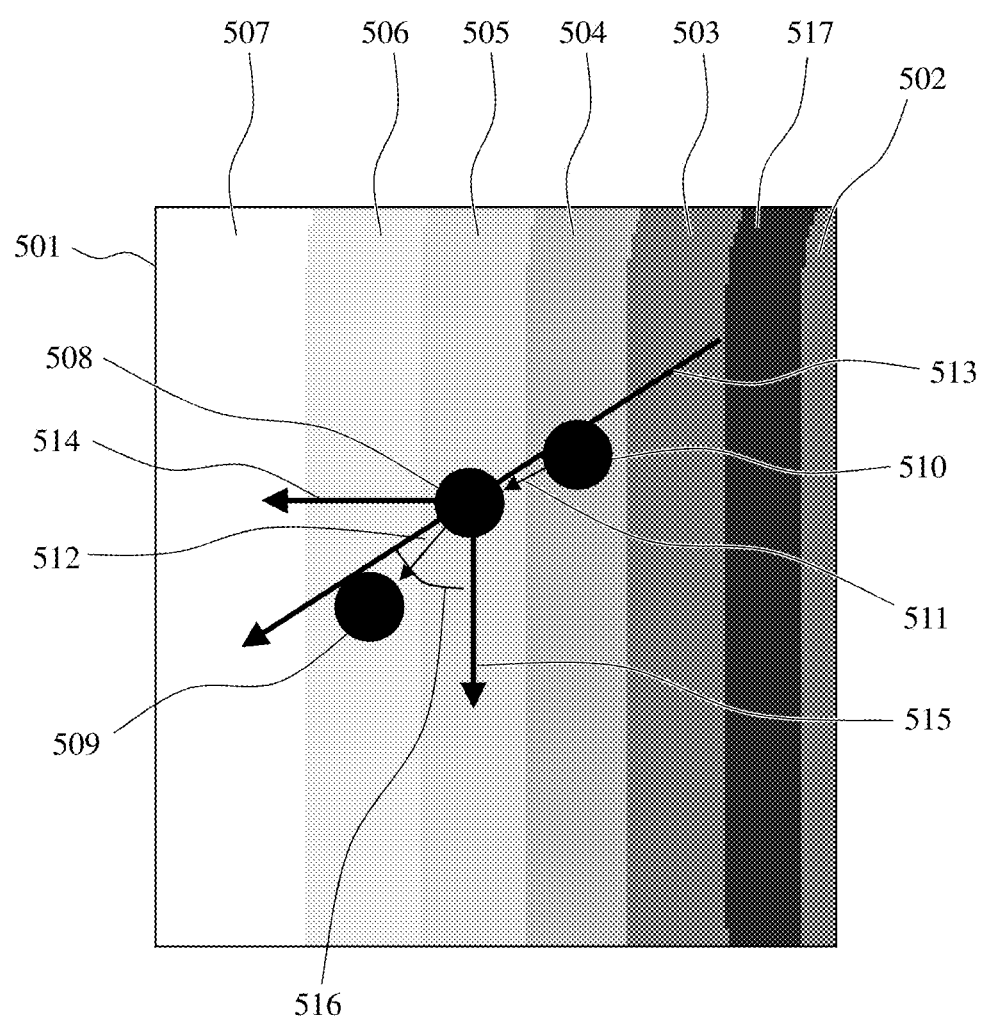
FIG. 5 is a view illustrating another method for creating a defect size image.

FIG. 5 exemplarily shows another method for creating the defect size image 401 as a result of the collation operation of the collation unit 120. That is, FIG. 5 shows a method different from that in FIG. 4. It should be noted that the method described with reference to FIG. 4 shows a case where pixels that form the inspected image contour line 311 have unchanged luminance values at positions where the pixels overlap the reference distance image 301.

Meanwhile, the method described with reference to FIG. 5 uses the luminance values of the reference distance image 301 (FIG. 3), a tilt 514 of the reference distance image 301, and a direction 513 of the tangent to the inspected image contour line 311 (FIG. 3).

An enlarged view 501 is a partially enlarged view of the reference distance image 301. The enlarged view 501 includes a "distance zero region" 517 having a luminance value of "zero," a "distance 1 region" 502 and a "distance 1 region" 503 each having a luminance value of "1," a "distance 2 region" 504 having a luminance value of "2", a "distance 3 region" 505 having a luminance value of "3," a "distance 4 region" 506 having a luminance value of "4," and a "distance 5 region" 507 having a luminance value of "5." In addition, the pixels 508, 509, and 510 are adjacent pixels on the inspected image contour line 311.

In FIG. 5, an arrow indicating the direction 513 of the tangent to the pixel 508 is depicted. The pixels 510 and 508 are adjacent pixels. Therefore, a direction 511 from the pixel 510 to the adjacent pixel (i.e., the pixel 508) can be easily calculated from the coordinates of the pixels. Likewise, the pixels 508 and 509 are adjacent pixels. Therefore, a direction 512 from the pixel 508 to the adjacent pixel (i.e., the pixel 509) can be easily calculated. In this embodiment, the direction 513 of the tangent to the pixel 508 is calculated as the mean vector of the direction 511 and the direction 512.

The tilt 514 of the reference distance image 301 is given by the direction of the tilt of the luminance values of the reference distance image 301, and is a direction in which the luminance value increases. In the enlarged view 501, the tilt 514 is calculated from the luminance values of a region including three pixels×three pixels, with the luminance value of a pixel that is adjacent to the pixel 508 as the center. A method for calculating the tilt is a common method of the image processing.

A contour line direction 515 is given as a counterclockwise direction of 90° with respect to the tilt 514 of the reference distance image 301. An angle 516 is calculated from the contour line direction 515 and the tangential direction 513. In FIG. 5, the angle 516 is 60°.

In this case, the luminance value of each pixel that forms the defect size image is determined as follows. As described above, in this embodiment, the pixel 508 is located in the "distance 3 region." Thus, the luminance value of the pixel 508 is "3." In addition, the angle 516 is 60°. At this time, the luminance value corresponding to the pixel 508 on the reference distance image 301 is given by the following formula.

$$3 \times \cos(60°) = 3 \times \sqrt{3}/2$$

This computation method can be generalized as can be seen in the following formula for any pixel of the inspected image contour line 311 and the reference distance image 301.

$$y = x \cdot \cos\theta$$

It should be noted that symbol x represents the luminance value of the reference distance image 301, θ represents the tilt of the reference distance image 301, and y represents the luminance value of the defect size image. The computation method herein is a method of modifying the luminance value at a position that overlaps the reference distance image 301 using a weight that reflects a local tilt of each pixel. Incidentally, when the tangential direction 513 coincides with the contour line direction 515 (θ=0°), the luminance value of the defect size image coincides with that shown in FIG. 4. Meanwhile, when the tangential direction 513 coincides with the tilt 514 of the reference distance image 301 (θ=90°), the luminance value of the defect size image becomes zero.

In this specification, a method for directly creating the defect size image 401 from the luminance value of the reference distance image 301 will be referred to as "Mode 1," and a method for creating the defect size image 401 using the luminance value of the reference distance image 301, the tilt 514 of the reference distance image 301, and the direction 513 of the tangent to the inspected image contour line 311 will be referred to as "Mode 2." The processing time of "Mode 1" can be shorter than that of "Mode 2" since "Mode 1" involves a smaller number of processing steps. Meanwhile, the area calculation accuracy of "Mode 1" is lower than that of "Mode 2."

It should be noted that the area calculation accuracy of "Mode 2" is higher than that of "Mode 1." However, "Mode 2" involves a greater number of processing steps than "Mode 1." This is the reason why the processing time of "Mode 2" is longer than that of "Mode 1."

As described above, each of "Mode 1" and "Mode 2" has both advantages and disadvantages. Therefore, it is desirable that "Mode 1" and "Mode 2" be selectively used in accordance with the intended use. In addition, as described above, a mode used by the collation unit 120 can be switched upon input of an operation to the mode switching entry field 140 of the operation screen 126.

[Detection of Defect Region]

Figure 6:
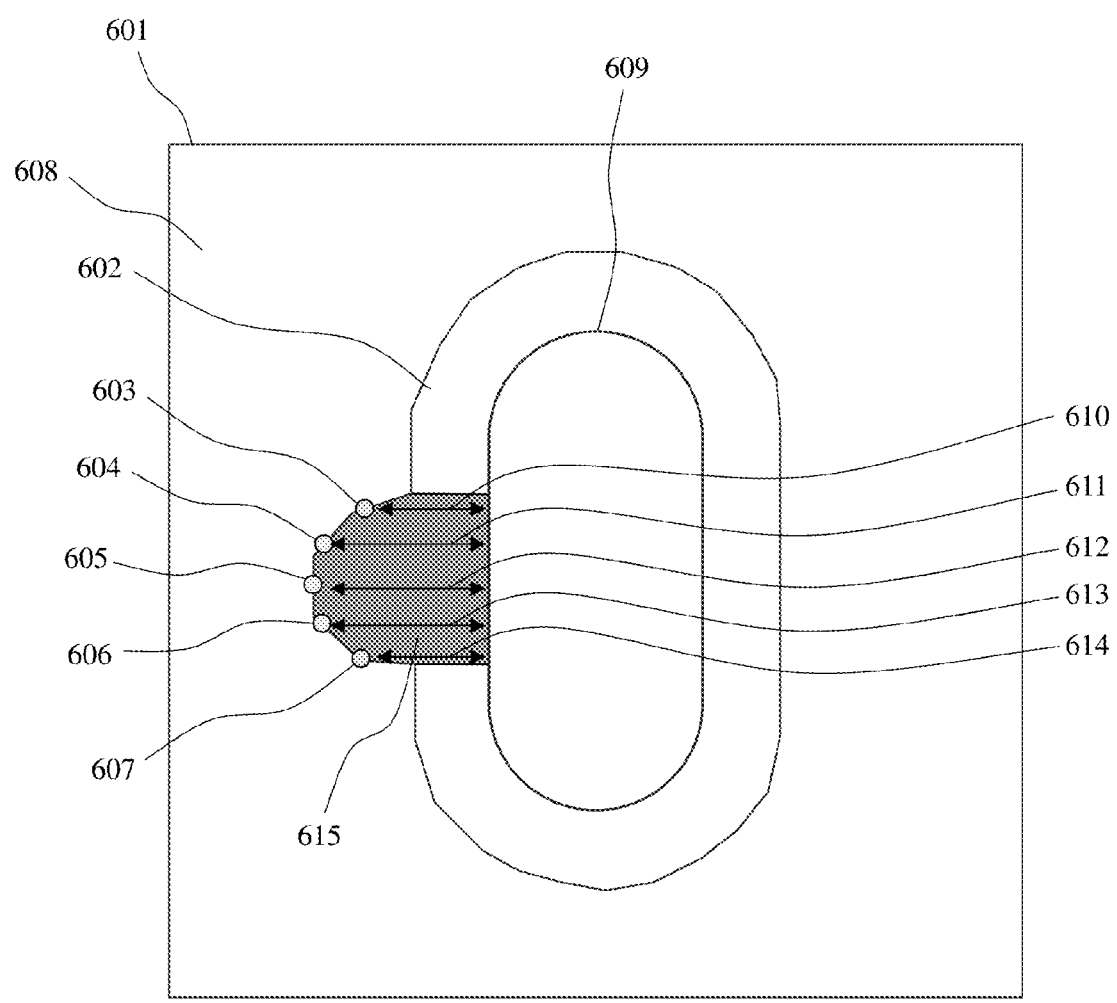
FIG. 6 is a view illustrating a defect extraction image that is created from a defect size image.

FIG. 6 shows the content of the operation of the defect candidate detection unit 121 to detect the defect region 131. The defect candidate detection unit 121 creates from the defect size image 401 a defect extraction image 601 including only the defect region 131 in accordance with the following procedures.

FIG. 6 represents an inspected image contour line 602 and a reference image contour line 609 for the sake of convenience. It should be noted, however, that these lines are shown only supplementarily to clarify the positional relationship of the defect region 615, and are not displayed in the actual defect extraction image 601.

FIG. 6 shows pixels 603, 604, 605, 606, and 607 on the contour line of the defect extraction image 601. A distance 610 shown by an arrow in FIG. 6 is the distance between the pixel 603 and the reference image contour line 609. A distance 611 shown by an arrow in FIG. 6 is the distance between the pixel 604 and the reference image contour line 609. A distance 612 shown by an arrow in FIG. 6 is the distance between the pixel 605 and the reference image contour line 609. A distance 613 shown by an arrow in FIG. 6 is the distance between the pixel 606 and the reference image contour line 609. A distance 614 shown by an arrow in FIG. 6 is the distance between the pixel 607 and the reference image contour line 609. It should be noted that the defect region 615 shown by a colored region represents a region of defects displayed in the defect extraction image 601.

Herein, each arrow that indicates the distance 610, 611, 612, 613, or 614 and the defect region 615 are shown for the sake of convenience, and are not present in the actual defect extraction image 601.

First, the defect candidate detection unit 121 compares each pixel of the defect size image 401 with the threshold 138 input to the defect dimension threshold entry field 128, and extracts only pixels whose values are greater than the threshold. It should be noted that the threshold 138 has been converted to conform to the reduced scale of the defect size image 401.

For example, in the reduced scale of the defect size image 401, when the threshold 138 is "Distance 2," the defect candidate detection unit 121 determines a group of pixels having distance information that is greater than or equal to "Distance 3" to be the defect region 615. In such a case, the defect candidate detection unit 121 extracts pixels whose luminance values are greater than or equal to three from among the pixels on the inspected image contour line 402 in FIG. 4. That is, the defect candidate detection unit 121 extracts the pixels 405, 406, 407, 408, and 409. Such pixels correspond to the pixels 603, 604, 605, 606, and 607 of the defect extraction image 601. The created defect extraction image 601 is provided to the defect size determination unit 122, the defect position determination unit 123, and the unit 124 for determining defects/determining if measurement is possible.

Next, the defect size determination unit 122 determines the sum total of the luminance values of the continuous pixels in the defect extraction image 601. In FIG. 6, the pixels 603, 604, 605, 606, and 607 are the continuous pixels.

In this embodiment, the luminance value of the pixel 603 is "3," the luminance value of the pixel 604 is "4," the luminance value of the pixel 605 is "4," the luminance value of the pixel 606 is "4," and the luminance value of the pixel 607 is "3." Thus, the sum total of such pixels is 18 (=3+4+4+4+3).

The luminance value of the pixel 603 and the distance 610 are the same, the luminance value of the pixel 604 and the distance 611 are the same, the luminance value of the pixel 605 and the distance 612 are the same, the luminance value of the pixel 606 and the distance 613 are the same, and the luminance of the pixel 607 and the distance 614 are the same. Further, the pixels 603, 604, 605, 606, and 607 are away by a distance of "1" in the contour line direction. Herein, the sum total of the luminance values of the pixels 603, 604, 605, 606, and 607 coincides with the area of the defect region 615.

The unit 124 for determining defects/determining if measurement is possible compares the calculated area of the defect region 615 with the threshold 139 input to the defect area threshold entry field 133. Herein, when the area of the defect region 615 is greater than the threshold 139, the unit 124 for determining defects/determining if measurement is possible determines that the defect region 615 is defective. Meanwhile, when the area of the defect region 615 is smaller than the threshold 139, the unit 124 for determining defects/determining if measurement is possible determines that the defect region 615 is not defective. It should be noted that the threshold 139 has been converted to conform to the reduced scale of the defect size image 401. Herein, when the area of the candidate region 615 is greater than or equal to the threshold 139, the area of the entire candidate region 615 is the area of the defect.

Although this embodiment illustrates a case where whether the candidate region 615 is defective or not is determined based only on the area of the candidate region 615, it is also possible to determine whether the candidate region 615 is defective or not based on the distance of (positional information on) the candidate region 615 from the reference image contour line 609. For example, when the maximum value of the luminance values of the pixels that form the defect extraction image 601 is greater than the threshold 138, the candidate region 615 is determined to be defective. It is also possible to determine whether the candidate region 615 is defective or not based on both the area of and the positional information on the candidate region 615.

Upon detection of a defect, the unit 124 for determining defects/determining if measurement is possible prohibits the execution of the length-measuring operation of the length-measuring scanning electron microscope. Meanwhile, when a defect is not detected, the unit 124 for determining defects/determining if measurement is possible continuously permits the execution of the length-measuring operation of the length-measuring scanning electron microscope.

[Conclusion]

As described above, when the defect inspection system in accordance with this embodiment is used, it is possible to realize defect detection that is sensitive to a defect size in a shorter processing time. In addition, when the defect inspection system in accordance with this embodiment is used, it is possible to calculate a defect size through comparison with a reference image as the standard data (i.e., reference data). Further, when the defect inspection system in accordance with this embodiment is used, it is possible to identify the position of the detected defect on the image. Further, when the defect inspection system in accordance with this embodiment is used, it is possible to control the detection of a defect in accordance with the size and/or the position of the candidate region 615. Further, when the defect inspection system in accordance with this embodiment is used, it is possible to visually check the position and the size of a defect on the image on the operation screen 126. Further, when the defect inspection system in accordance with this embodiment is used, it is possible to automatically determine whether the following length measurement is executable or not in accordance with the presence or absence, size and/or position of a defect. Furthermore, when the defect inspection system in accordance with this embodiment is used, it is possible to provide the automatic determination result of the measurement to a user via the operation screen 126.

Embodiment 2

The previous embodiment has described a case where the defect extraction image 601 is created from the defect size image 401, and then, the presence or absence of defects and whether the following measurement is executable or not are determined based on the size of the defect region 615 extracted from the defect extraction image 601.

Figure 7:
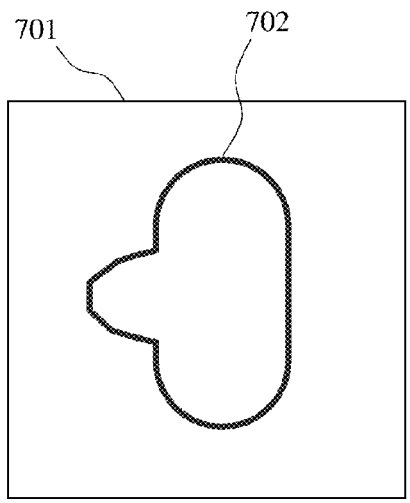
FIG. 7 is a view illustrating a method for detecting the size of the contour of a defect.
Figure 7:
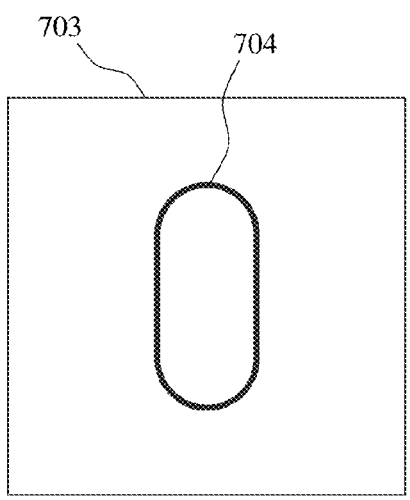
Figure 7:
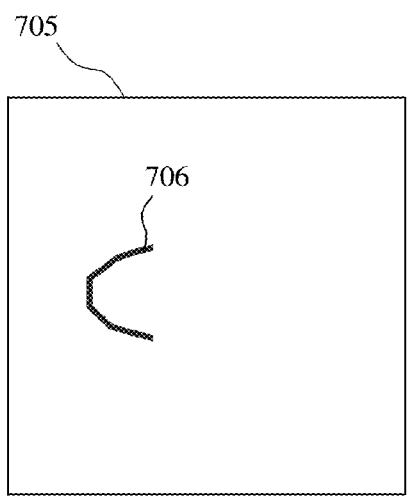

However, as shown in FIG. 7, it is also possible to compare an inspected electron microscope image 701 with a reference contour line image 703, create a differential image 705 of the inspected image contour line 702 and the reference image contour line 704, and determine the presence or absence of defects as well as whether the following measurement is executable or not based on a differential contour line 706 corresponding to the difference between the two contour lines.

Specifically, it is possible to determine the size and length of the differential contour line 706 from the differential image 705 and then determine the presence or absence of defects and whether the following measurement is executable or not by comparing each value with a corresponding threshold. It should be noted that the basic configuration of the defect inspection system in accordance with this embodiment may be the same as the device configuration shown in FIG. 1.

Other Embodiment

The present invention is not limited to the aforementioned embodiments, and includes a variety of variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment.

Some or all of the aforementioned structures, functions, processing units, processing means, and the like may be implemented as an integrated circuit or other hardware, for example. Alternatively, each of the aforementioned structures, functions, and the like may be implemented through analysis and execution of a program that implements each function by a processor. That is, each of the aforementioned structures, functions, and the like may also be implemented as software. Information such as the program that implements each function, tables, and files can be stored in a storage device such as memory, a hard disk, or a SSD (Solid State Drive); or a storage medium such as an IC card, an SD card, or a DVD.

In addition, the control lines and information lines represent those that are considered to be necessary for the description, and do not necessarily represent all control lines and information lines that are necessary for a product. Thus, in practice, almost all structures may be considered to be mutually connected.

REFERENCE SIGNS LIST

101 Electron microscope
102 Electron gun
103 Electron beam
104 Electron lens
105 Deflector
106 Sample
107 Sample table
108 Sample table control device
109 Secondary signal
110 Electron detector
111 Intensity signal
112 Control signal
113 Control system
114 Image processing processor
115 Digital image creation unit
116 Inspected image contour line extraction unit
117 Reference data storage system
118 Reference image contour line extraction unit
119 Distance image conversion unit
120 Collation unit
121 Defect candidate detection unit
122 Defect size determination unit
123 Defect position determination unit
124 Unit for determining defects/determining if measurement is possible
125 Display device
126 Operation screen
127 Inspected electron microscope image
128 Defect dimension threshold entry field
130 Reference image contour line
131 Defect region
132 Structure
133 Defect area threshold entry field
134 Operation device
135 Inspected image contour line
136 Defect list
137 Image matching unit
138 Threshold
139 Threshold
140 Mode switching entry field
201 Inspected electron microscope image
202 Structure
203 Inspected contour line image
204 Inspected image contour line
205 Reference contour line image
206 Reference image contour line
207 Reference distance image
301 Reference distance image
311 Inspected image contour line
401 Defect size image
402 Inspected image contour line
501 Enlarged view
511 Direction
512 Direction
513 Tangential direction 514 Tilt of reference distance image
515 Contour line direction
516 Angle
601 Defect extraction image
602 Inspected image contour line
609 Reference image contour line
615 Defect region
706 Differential contour line

The invention claimed is:

1. A semiconductor inspection system comprising:
an inspected image acquisition unit configured to acquire an inspected image by irradiating a sample with a charged particle beam;
a first contour line extraction unit configured to extract a first contour line from the inspected image;
a second contour line extraction unit configured to extract a second contour line from a reference image corresponding to the inspected image;
a distance image creation unit configured to create a reference distance image by providing pixel information to a plurality of pixels, including pixels corresponding to the second contour line and pixels surrounding the pixels corresponding to the second contour line, each of the plurality of pixels being provided with pixel information according to its distance from one of the pixels corresponding to the second contour line;
a positions adjustment unit configured to align the first contour line with the reference distance image;
a collation unit configured to collate the first contour line and the reference distance image aligned by the position adjustment, and provide pixel information to pixels of the first contour line based on the pixel information provided to corresponding pixels in the reference distance image, and
a determination unit configured to calculate a size of a region defined by a portion of the first contour line that is not located at a predetermined position based on the pixel information provided to pixels of the first contour line.

2. The semiconductor inspection system according to claim 1, wherein whether the region defined by the portion of first contour line is a defect or not is determined based on the size of the region.

3. The semiconductor inspection system according to claim 2, wherein the size of the calculated region is an area of the region.

4. The semiconductor inspection system according to claim 2, further comprising an input device configured to input a threshold for determining whether the region defined by the portion of first contour line is a defect or not.

5. The semiconductor inspection system according to claim 1, further comprising a unit configured to, when region defined by the portion of first contour line is determined to be a defect from the size of the region, determine whether to permit execution of measurement or not.

6. The semiconductor inspection system according to claim 1, wherein the determination unit detects the region defined by the portion of the first contour line by providing each pixel on the first contour line with a luminance value of the reference distance image at a position overlapping each pixel.

7. The semiconductor inspection system according to claim 1, wherein the pixel information respectively provided to each pixel of the first contour line is calculated further based on a direction of a tangent to the first contour line, and a tilt of the reference distance image.

8. The semiconductor inspection system according to claim 1,
wherein the collation unit is configured to apply one of a first method or a second method to each pixel on the first contour line, based on a mode selection by a user,
the first method includes providing respective pixel information to each pixel of the first contour line based on the pixel information provided to corresponding pixels in the reference distance image, and
the second method includes providing respective pixel information to each pixel of the first contour line based on the pixel information provided to corresponding pixels in the reference distance image, a direction of a tangent to the first contour line, and a tilt of the reference distance image.

9. The semiconductor inspection system according to claim 8, further comprising an operation device configured to receive the mode selection.

10. The semiconductor inspection system according to claim 1, wherein
after the region is calculated, a distance of the region from the second contour line is calculated, and whether the region is a defect or not is determined based on the distance and the size of the region.

11. The semiconductor inspection system according to claim 10, further comprising an input device configured to receive an input corresponding to a threshold for determining whether a portion of the region defined by the first contour line is a defect or not.

12. A semiconductor inspection system comprising:
an inspected image acquisition unit configured to acquire an inspected image by irradiating a sample with a charged particle beam;
a first contour line extraction unit configured to extract a first contour line from the inspected image;
a second contour line extraction unit configured to extract a second contour line from a reference image corresponding to the inspected image;
a distance image creation unit configured to create a reference distance image by providing pixel information to a plurality of pixels, including pixels corresponding to the second contour line and pixels surrounding the pixels corresponding to the second contour line, each of the plurality of pixels being provided with pixel information according to its distance from one of the pixels corresponding to the second contour line;
a positions adjustment unit configured to align the first contour line with the reference distance image;
a collation unit configured to collate the first contour line and the reference distance image aligned by the position adjustment, and provide pixel information to pixels of the first contour line based on the pixel information provided to corresponding pixels in the reference distance image, and
a determination unit configured to calculate a distance between a portion of the first contour line and a corresponding portion of the second contour line based on the pixel information provided to the pixels of the first contour line.

13. The semiconductor inspection system according to claim 12, wherein whether a region defined by the portion of first contour line is a defect or not is determined based on a size of the distance.

* * * * *